(12) United States Patent
Janssen

(10) Patent No.: US 8,892,806 B2
(45) Date of Patent: Nov. 18, 2014

(54) INTEGRATED CIRCUIT, MEMORY DEVICE, METHOD OF OPERATING AN INTEGRATED CIRCUIT, AND METHOD OF DESIGNING AN INTEGRATED CIRCUIT

(75) Inventor: Hans Joachim Janssen, Mülheim/Ruhr (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1821 days.

(21) Appl. No.: 11/683,357

(22) Filed: Mar. 7, 2007

(65) Prior Publication Data

US 2008/0219037 A1 Sep. 11, 2008

(51) Int. Cl.
| | | |
|---|---|---|
| *G06F 13/00* | (2006.01) | |
| *G06F 17/50* | (2006.01) | |
| *G06F 15/00* | (2006.01) | |
| *H03K 19/173* | (2006.01) | |

(52) U.S. Cl.
CPC .................................. *G06F 17/5072* (2013.01)
USPC .................. 710/316; 326/41; 326/46; 712/11

(58) Field of Classification Search
USPC ........................... 710/316; 326/46, 41; 712/11
See application file for complete search history.

(56) References Cited

U.S. PATENT DOCUMENTS

| | | | | |
|---|---|---|---|---|
| 4,977,558 A | * | 12/1990 | Iguchi et al. | 370/542 |
| 5,136,188 A | * | 8/1992 | Ha et al. | 326/39 |
| 5,715,172 A | | 2/1998 | Tzeng | |
| 6,144,220 A | * | 11/2000 | Young | 326/41 |
| 6,522,167 B1 | * | 2/2003 | Ansari et al. | 326/39 |
| 6,687,796 B1 | * | 2/2004 | Laine et al. | 711/149 |
| 6,865,114 B2 | | 3/2005 | Pio | |
| 6,889,304 B2 | | 5/2005 | Perego et al. | |
| 6,952,115 B1 | * | 10/2005 | Andrews et al. | 326/46 |
| 7,009,423 B1 | * | 3/2006 | Andrews et al. | 326/46 |
| 7,268,581 B1 | * | 9/2007 | Trimberger et al. | 326/38 |
| 7,398,487 B1 | * | 7/2008 | Lien | 716/3 |
| 7,414,875 B2 | * | 8/2008 | Lee et al. | 365/63 |
| 7,415,567 B2 | * | 8/2008 | Jeddeloh | 711/5 |
| 2006/0271899 A1 | * | 11/2006 | Tan et al. | 716/13 |
| 2007/0223400 A1 | * | 9/2007 | Laarhuis et al. | 370/256 |

FOREIGN PATENT DOCUMENTS

DE       19530669 A1    2/1996

* cited by examiner

*Primary Examiner* — Paul R Myers
*Assistant Examiner* — Christopher A Daley
(74) *Attorney, Agent, or Firm* — Eschweiler & Associates, LLC

(57) ABSTRACT

An integrated circuit, a memory device, a method of operating an integrated circuit and a method of designing an integrated circuit are provided. An integrated circuit comprises a plurality of logical elements and a bus carrying signals for said plurality of logical elements. The integrated circuit also comprises a routing unit having an input coupled to said bus and a plurality of outputs to route signals received at said input to at least one of said outputs. The integrated circuit also comprises a plurality of lines coupled to said plurality of outputs to conduct said signals from said routing unit to at least one of said plurality of logical elements, wherein at least one of said plurality of lines couples said routing unit to only one of said logical elements.

27 Claims, 10 Drawing Sheets

INTEGRATED CIRCUIT, MEMORY DEVICE, METHOD OF OPERATING AN INTEGRATED CIRCUIT, AND METHOD OF DESIGNING AN INTEGRATED CIRCUIT

FIELD OF THE INVENTION

The present invention relates to an integrated circuit, a memory device, a method of operating an integrated circuit, and a method of designing an integrated circuit. In particular, the present invention relates to integrated circuits comprising a plurality of logical elements and to methods of operating and designing such integrated circuits.

BRIEF DESCRIPTION OF THE SEVERAL VIEWS OF THE DRAWINGS

Hereinafter, exemplary embodiments of the invention will be described with reference to the drawings.

FIG. 9 is a flow diagram representation of a method of designing an integrated circuit according to an embodiment of the present invention.

DETAILED DESCRIPTION OF THE INVENTION

Figure 1:
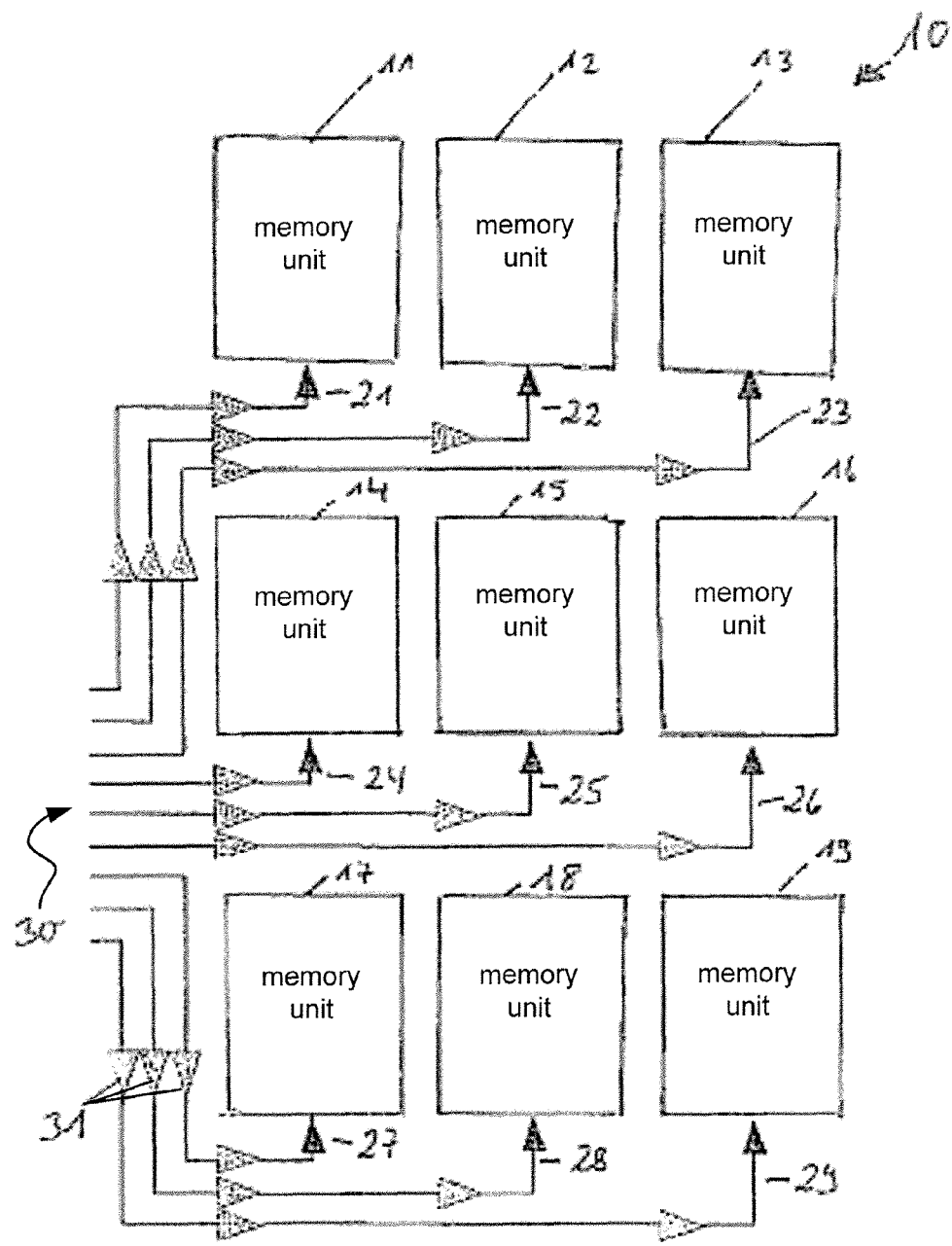
FIG. 1 is a schematic block diagram representation of an integrated circuit according to an embodiment of the present invention.

In the following, exemplary embodiments of the present invention will be described in detail. It is to be understood that the following description is given only for the purpose of illustrating the principles of the invention and is not to be taken in a limiting sense. Rather, the scope of the invention is defined only by the appended claims and is not intended to be limited by the exemplary embodiments described hereinafter.

It is also to be understood that, in the following description of exemplary embodiments, any direct connection or coupling between functional blocks, devices, components, or other physical or functional units shown in the drawings or described herein could also be implemented by an indirect connection or coupling.

It is to be understood that the features of the various exemplary embodiments described herein may be combined with each other, unless specifically noted otherwise.

In some integrated circuits, a common bus may be provided carrying signals for all, or at least a plurality, of logical elements and may be coupled to these logical elements to provide signals, e.g., data, to the logical elements. However, when data is routed to the logical elements using a single, common bus, or any other bus system in which one line is connected to several logical elements, data transfer to only one of the logical elements may result in the toggling of signals associated with the other logical elements coupled to the bus. Such toggling may in turn effect power dissipation due to the charging and discharging of parasitic capacitances or intrinsic capacitances of standard cells associated with the other logical elements, without providing any functional effect. An example for such an integrated circuit is a memory device in which one bus is coupled to a plurality of memory units.

FIG. 1 is a schematic block diagram representation of an integrated circuit according to an exemplary embodiment of the present invention. In the embodiment of FIG. 1, the integrated circuit is formed as a memory device 10. The memory device 10 comprises a plurality of memory units 11-19 which are spatially separate from each other and represent logical elements of the circuit. While the memory device 10 of the exemplary embodiment of FIG. 1 is shown to comprise nine memory units 11-19, this number is only exemplary, and in other embodiments the memory device may comprise any other suitable number of memory units. In one exemplary embodiment, the memory device 10 constitutes a logical memory, the memory units 11-19 being memory instances of the logical memory. As used herein, the term "memory unit" refers to a memory which, by itself, may comprise a large number of memory cells. In exemplary embodiments, each of the memory units 11-19 may have a storage capacity on the order of several tens or several hundreds of bits or even kilobits (Kb). The memory units may be implemented in the form of any memory technology, e.g., static random access memory (SRAM) or dynamic random access memory (DRAM).

The memory device 10 further comprises a plurality of lines 21-29, each of which is coupled to one of the memory units 11-19 to conduct a signal to the respective memory unit. Since each of the lines 21-29 is coupled to only one of the memory units 11-19, a signal may be transferred to each of the memory units 11-19 without causing the signals associated with other memory units to toggle. In other words, in the memory device 10, each of the memory units 11-19 is provided with a dedicated bus that allows a signal to be conducted to only the respective memory unit. As schematically indicated in FIG. 1, amplifier cells 31 may be provided along the lines 21-29 as suitable. The root ends of the lines 21-29, i.e., the terminals that are not connected to the memory units 21-29, are all located in a region 30. As will be described in more detail below, in an exemplary embodiment signal routing is performed in the region 30 proximal to the root ends of the lines 21-29.

In the memory device 10, any type of signal may be transferred to the memory units 11-19 via the lines 21-29. Exemplary signals include data, address information specifying, e.g., an address in one of the memory units 11-19 at which data is to be stored, or also control signals. Examples of control signals include, but are not limited to, signals such as chip select (CS), write enable (WE), row access strobe (RAS), column access strobe (CAS) signals and other such control signals.

In FIG. 1, only one bus system including the lines 21-29 is shown for reasons of clarity, the lines 21-29 being provided for conducting signals that correspond to a given signal type, e.g., address information. It will be appreciated that in other embodiments further bus systems may be provided when several types of signals are to be conducted to the memory units 11-19. As will be described in more detail with reference to FIGS. 4 and 5, the lines of the various bus systems may be respectively coupled to only one memory unit, similar to the bus system shown in FIG. 1, or to groups of memory units.

Figure 2:
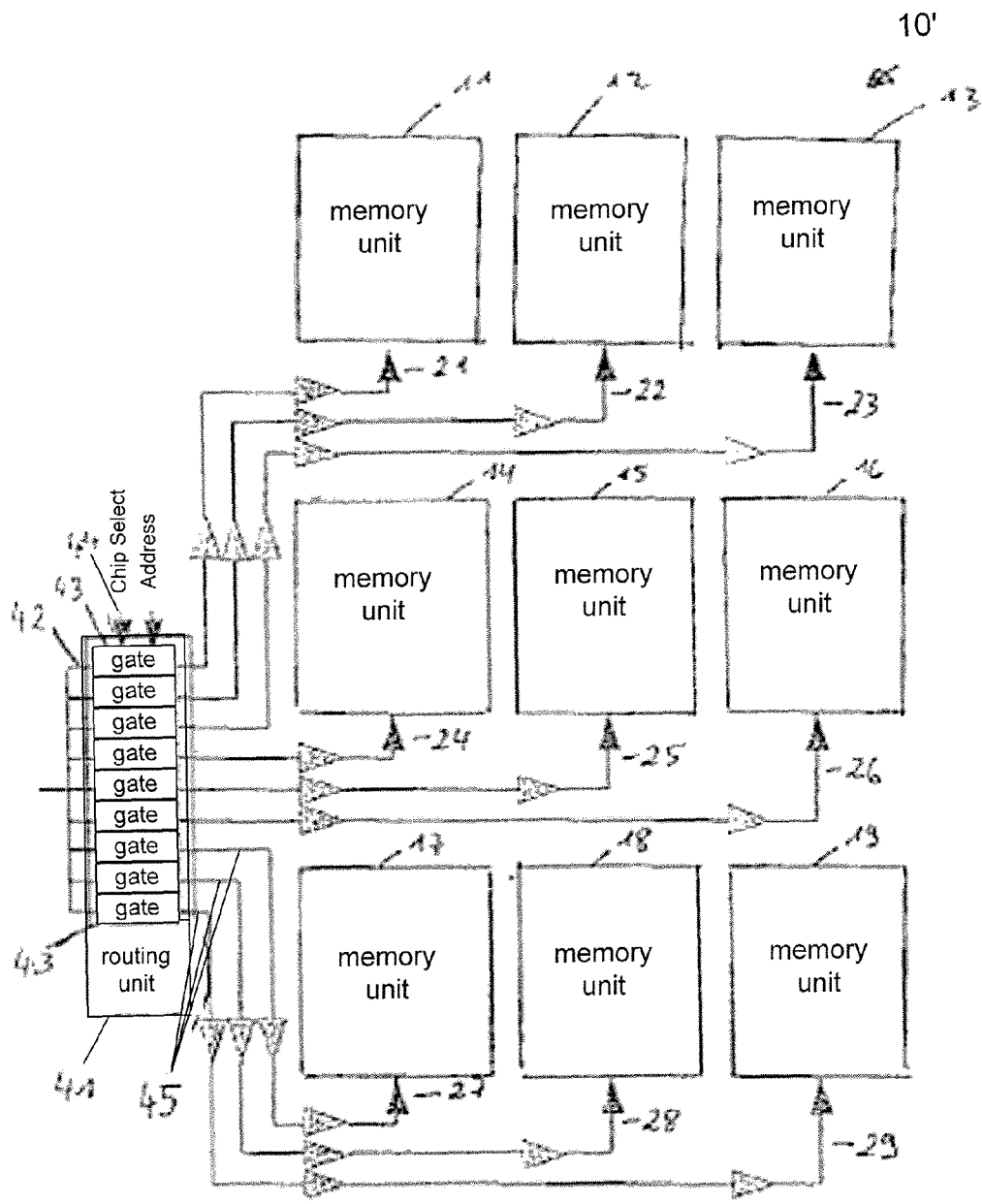
FIG. 2 is a schematic block diagram representation of an integrated circuit according to another embodiment of the present invention.

FIG. 2 is a schematic block diagram representation of an integrated circuit according to another exemplary embodiment of the present invention. In the embodiment of FIG. 2, the integrated circuit is formed as a memory device 10'. The memory device 10' comprises a plurality of memory units 11-19, representing logical elements of the integrated circuit, and a corresponding plurality of lines 21-29, respectively coupled to only one of the memory units 11-19. The configuration and operation of the memory units 11-19 and the lines 21-29 of the memory device 10' is identical to the one of the corresponding components described with reference to the embodiment of FIG. 1 above.

The memory device 10' further comprises a signal routing unit or gating unit 41 placed in the region 30 (FIG. 1) in which the root ends of the lines 21-29 are located. In the memory device 10', the routing unit is configured as a gating unit comprising a plurality of gating cells. However, in other embodiments the routing unit may also be implemented differently, e.g., as one or several demultiplexers, as will be explained in more detail below. The gating unit 41 has an input or a plurality of inputs 42 to receive a signal and a plurality of outputs 45 and routes a signal received at the input 42 to one of the outputs 45. To perform signal routing, the gating unit 41 comprises a plurality of gating cells 43 (nine in the exemplary embodiment shown in FIG. 2), each coupled to the input 42 and one of the outputs 45, the gating cells 43 being controlled so as to provide a signal received at the input 42 to one of the outputs 45 based on a control signal. As used herein, the term "gating cell" refers to a cell having an input and an output, which cell outputs a signal received at its input at its output in a controllable manner. The gating unit 41 further comprises a control input 44 to receive the control signal. In an exemplary embodiment, the control signal comprises a chip select (CS) signal and address information. In an embodiment, the address information comprises information specifying the memory unit of the plurality of memory units 11-19 which is to be accessed. In an embodiment, each of the gating cells 43 may comprise at least one of an AND- and OR-gate which is controlled based on the CS signal and the address information received at the control input 44, so as to output the signal received at the input 42 at the respective output 45. In one embodiment, the signal received at input 42 is output at only one of the outputs 45 at a time. In another embodiment, the signal received at the input 42 may be output at several of the outputs 45 at a time.

Each of the outputs 45 of the gating unit 41 is coupled to one of the lines 21-29, so that each of the lines 21-29 connects one of the memory units 11-19 to the gating unit 41 to conduct signals from the gating unit 41 to one of the memory units 11-19. In the memory device 10' of the exemplary embodiment of FIG. 2, the appropriate line or lines 11-19 to which the signal received at the input 42 of the gating unit 41 is to be output is selected by the gating unit 41, i.e., signal gating is performed at a position adjacent to or otherwise in proximity to the root ends of the lines 21-29. In one embodiment, the gating unit 41 is configured to output the signal to only those lines 11-19 which connect to the memory unit or memory units 11-19 to which the signal is addressed. In this manner, toggling of signals at the other memory units may be suppressed.

In the memory device 10' of the exemplary embodiment of FIG. 2, in the gating unit 41 there is provided a gating cell 43 that is associated with respectively one of the lines 21-29, each of which is in turn coupled to only one of the memory units 11-19. As will be described more fully below, this configuration is only exemplary, and other bus systems may be implemented in other embodiments of the invention. Further, it will be appreciated that the gating unit 41 schematically shown in FIG. 2 and explained above only shows the componentry that is associated with the lines 21-29, i.e., with the transfer of signals having a given signal type to the memory units. In other embodiments, in which signals of various signal types are routed from the gating unit 41 to the memory units 11-19, the gating unit 41 may comprise a correspondingly larger number of gating cells 43 to route signals having various signal types, as will be described more fully below.

Figure 3:
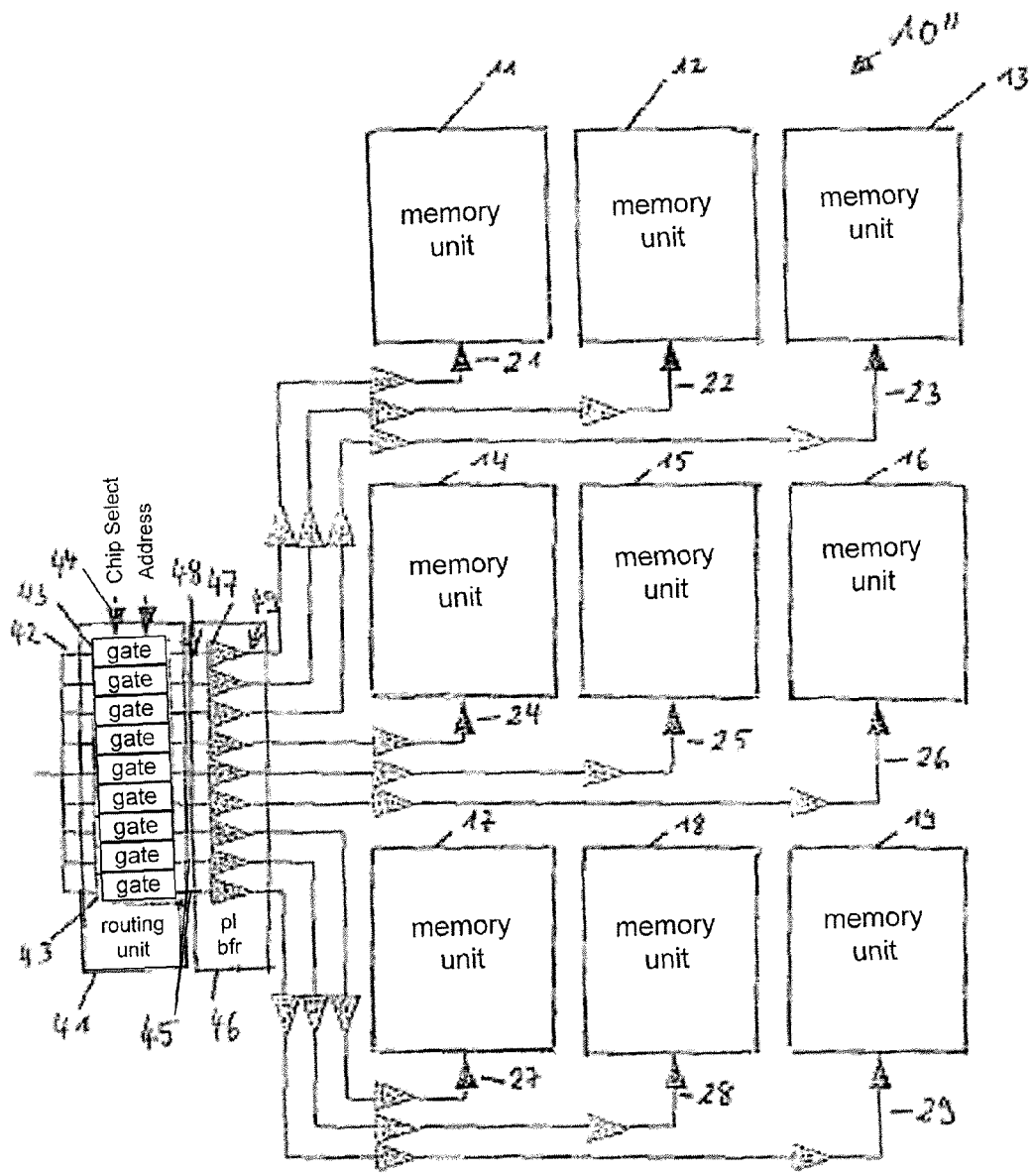
FIG. 3 is a schematic block diagram representation of an integrated circuit according to another embodiment of the present invention.

FIG. 3 is a schematic block diagram representation of an integrated circuit, again configured as a memory device 10", according to yet another exemplary embodiment of the present invention. The memory device 10" comprises a plurality of memory units 11-19, representing logical elements of the integrated circuit, a plurality of lines 21-29, each of which is coupled to one of the memory units, and a routing unit, again configured as a gating unit 41, to route a signal received at input 42 of the gating unit 41 via the respective line 21-29 to one of the memory units 11-19. The configuration and operation of these components is identical to the one of the corresponding components explained with reference to the memory device 10' of the exemplary embodiment of FIG. 2.

The memory device 10" further comprises a plurality of amplifier cells 47, each of which is associated with one of the gating cells 43 of the gating unit 41 and is placed adjacent to or otherwise in proximity to the respective gating cell 43. A plurality of inputs 48 of the amplifier cells 47 is coupled to the outputs 45 of the gating unit 41, and a plurality of outputs 49 of the amplifier cells 47 is coupled to the lines 21-29. In other words, in the memory device 10" of the exemplary embodiment of FIG. 3, the outputs 45 of the gating unit 41 are respectively coupled to the lines 21-29 via one of the amplifiers 47.

In addition to providing signal amplification, the amplifiers 47 may also be employed to enforce placement of the gating unit 41 at the root end of the bus system comprising lines 21-29, as will be explained in more detail with reference to FIG. 10 below. In an exemplary embodiment, a placement buffer 46 comprises the amplifier cells 47, the placement buffer 46 being "manually" positioned in, e.g., the physical synthesis of the memory device, i.e., the position of the placement buffer 46 is specified in the physical synthesis so as to restrict automated design optimization.

While the memory devices 10, 10' and 10" shown in FIGS. 1-3 and explained above are shown to comprise nine memory units, each of which has a dedicated bus coupled to only one memory unit, the present invention is not restricted thereto. In particular, any suitable plurality of memory units or logical elements may be implemented in other embodiments. Still further, in other embodiments, the bus system may be configured so that several of the memory units or logical elements are grouped together and are connected to a joint bus, as will be explained next.

Figure 4:
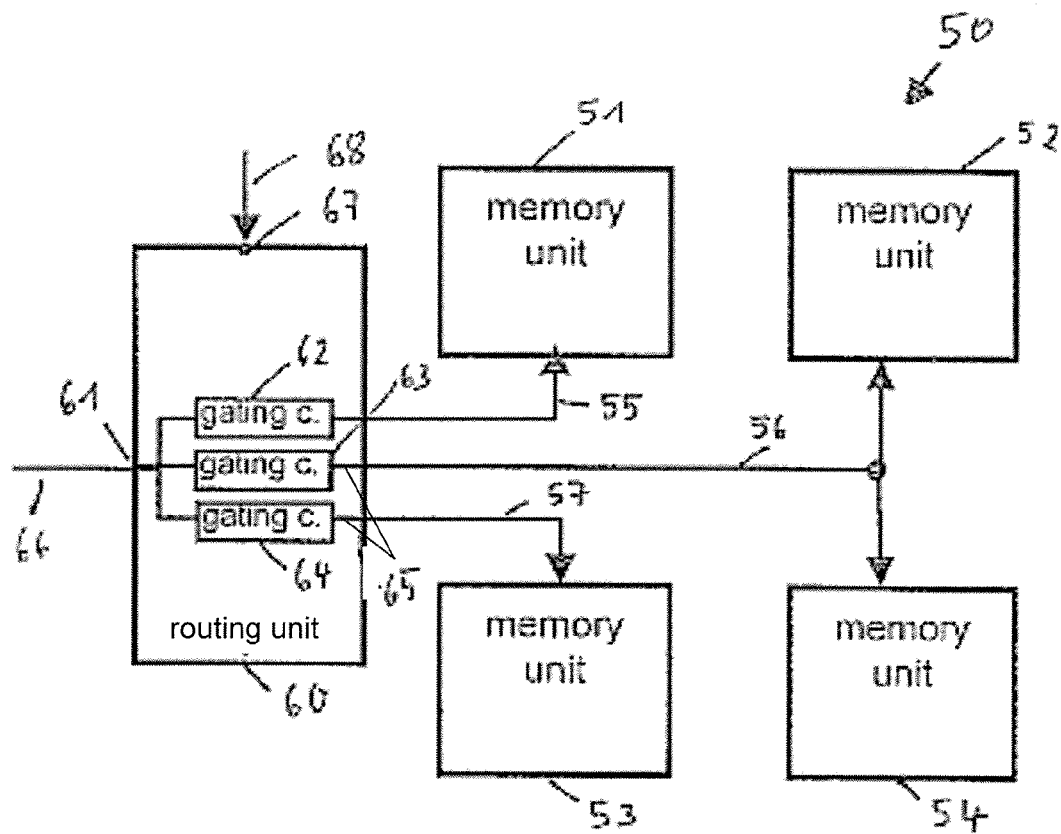
FIG. 4 is a schematic block diagram representation of an integrated circuit according to another embodiment of the present invention.

FIG. 4 is a schematic block diagram representation of an integrated circuit, again configured as a memory device 50 according to another embodiment. The memory device 50 comprises a plurality of memory units 51-54, representing logical elements of the integrated circuit (four in the exemplary embodiment shown in FIG. 4) and a routing unit which is configured as a gating unit 60. The gating unit 60 comprises a plurality of gating cells 62-64 (three in the exemplary embodiment shown in FIG. 4) coupled to an input 61 to receive a signal 66 having a given signal type and to route the signal received at the input 61 to one of a plurality of outputs 65 of the gating unit 60. Signal routing is performed by controlling the gating cells 62-64 based on a control signal 68 received at a control input 67 of the gating unit 60.

The plurality of outputs 65 is coupled to a plurality of lines 55-57 that conduct signals from the gating unit 60 to the memory units 51-54. The line 55 connects the output associated with gating cell 62 to the memory unit 51. The line 57 connects the output associated with gating cell 64 to the memory unit 53. The line 56 connects the output associated with gating cell 63 to both memory unit 52 and memory unit 54.

In the memory device 50 according to the exemplary embodiment of FIG. 4, while the memory units 51 and 53 have dedicated lines 55 and 57, respectively, connected to only these memory units, the memory units 52 and 54 share a line or bus 56 via which signals are transferred from the gating unit 60 to the memory units 52 and 54, respectively. Thus, a subset of memory units, such as memory units 52 and 54, may be connected to one joint bus 56, while other memory units 51, 53 have dedicated lines 55, 57 associated with them to connect these memory cells to the gating unit 60.

In the memory device 50, signal routing is performed by the gating unit 60 which comprises the gating cells 62-64 that are all disposed in a given region located adjacent to or otherwise in proximity to the root end of the bus system comprising lines 55-57. In other words, in the memory device 50, the gating unit 60 is again placed in a pre-defined region proximal to the root end of the bus system.

It will be appreciated that the grouping of memory units schematically indicated in FIG. 4, i.e., the selection of memory units that are provided with a dedicated bus and of the memory units that share a bus, is only exemplary and that other combinations of memory cell grouping may be implemented in other embodiments. The selection of memory units that are provided with a dedicated bus and of the memory units that share one or several busses may be made according to various criteria. In an exemplary embodiment, the selection may be made based on the geometrical arrangement of memory units and the length of signal lines required to interconnect different memory units. In another embodiment, the selection may be made based on the type of signal that is to be routed via the bus system, and an anticipated signal switching behavior. In an exemplary embodiment, memory units are grouped together to share a bus when the memory units are located adjacent to or otherwise in proximity to each other so that the additional distance required to connect a further memory unit to the bus is short, and the energy dissipation associated, e.g., with the additional parasitic capacitances is low. In another embodiment, a memory unit is selected to be provided with a dedicated bus that connects to only this memory unit for signals that are anticipated to be frequently addressed to this memory unit and/or that are anticipated to be switched at a high frequency. For example, when data is anticipated to be frequently written into memory unit 51, then a dedicated bus 55 may be provided to conduct data signals to the memory unit 51 only.

While not shown in FIG. 4 for reasons of clarity, the memory device 50 of the exemplary embodiment of FIG. 4 may also comprise amplifier cells or any other suitable cells arranged along the lines 55-57, as required for the specific application.

Still further, while the data connections shown in FIG. 4 only represent the bus system associated with signals having one given signal type, it will be appreciated that additional lines and additional gating cells may be incorporated to accommodate signal routing for signals having a plurality of different signal types, e.g., signals that correspond to data, to address information, to bit select signals carried by bit select lines, and/or to control signals for the memory units.

Figure 5:
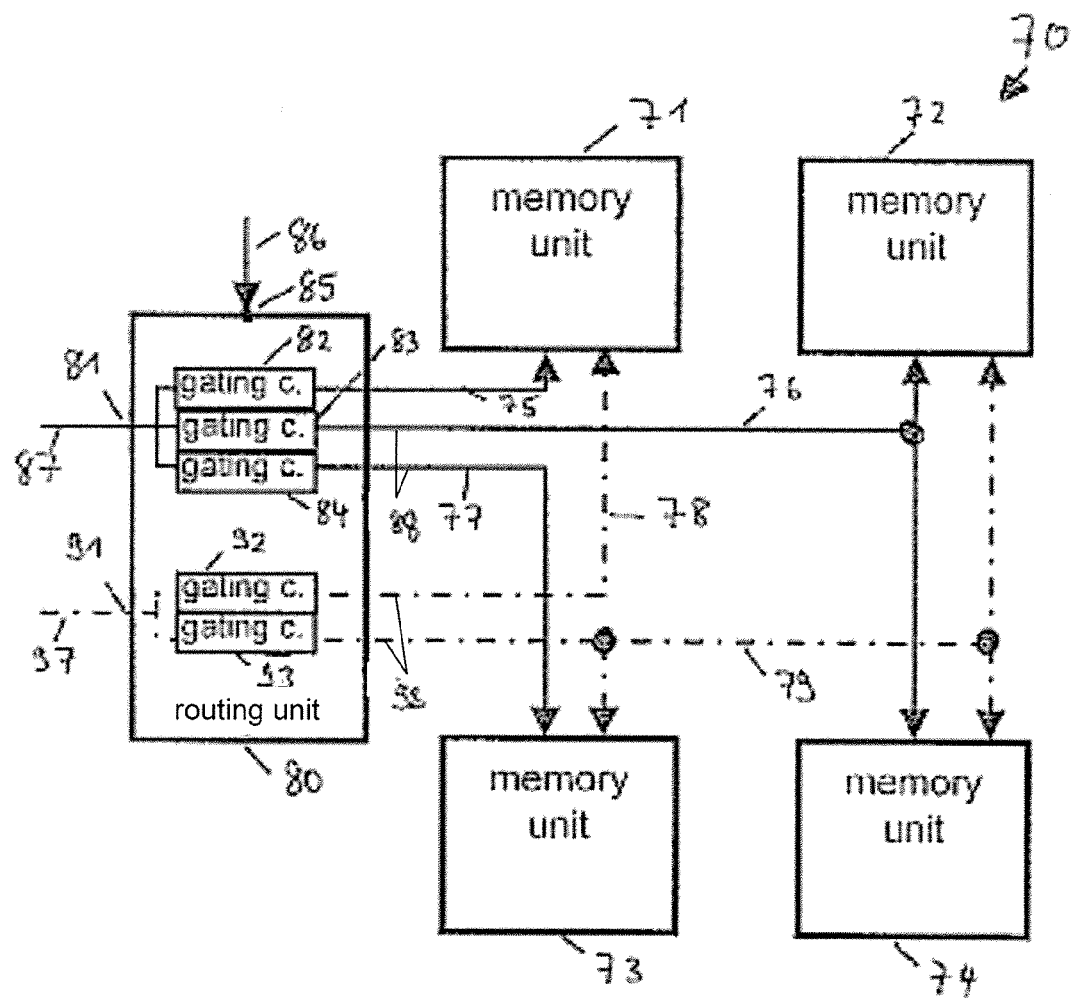
FIG. 5 is a schematic block diagram representation of an integrated circuit according to another embodiment of the present invention.

FIG. 5 is a schematic block diagram representation of an integrated circuit, again configured as a memory device 70 according to yet another embodiment. The memory device 70 comprises a plurality of memory units 71-74 (four in the exemplary embodiment shown in FIG. 5), representing logical elements of the integrated circuit, and a routing unit which is configured as a routing unit or gating unit 80. The gating unit 80 comprises a plurality of gating cells 82-84 (three in the exemplary embodiment shown in FIG. 5) coupled to an input 81 to receive a signal 87 having a given signal type and to route the signal received at the input 81 to one of a plurality of outputs 88 of the gating unit 80. The gating unit 80 further comprises a further plurality of gating cells 92, 93 (two in the exemplary embodiment shown in FIG. 5) coupled to a further input 91 to receive a signal 97 having a further given signal type and to route the signal received at the second input 91 to one of a further plurality of outputs 98 of the gating unit 80. Signal routing for signals having the given signal type is performed by controlling the gating cells 82-84 based on a control signal 86 received at a control input 85 of the gating unit 80, and signal routing for signals having the further given signal type is performed by controlling the gating cells 92-93 based on the control signal 86.

The plurality of outputs 88 via which signals having the given signal type are output is coupled to a plurality of lines 75-77 that conduct the signals having the given signal type from the gating unit 80 to the memory units 71-74. The line 75 connects the output associated with gating cell 82 to the memory unit 71. The line 77 connects the output associated with gating cell 84 to the memory unit 73. The line 76 connects the output associated with gating cell 83 to both memory unit 72 and memory unit 74.

Similarly, the further plurality of outputs 98 via which signals having the further given signal type are output is coupled to a further plurality of lines 78, 79 that conduct the signals having the further given signal type from the gating unit 80 to the memory units 71-74, line 78 being coupled to memory unit 71 only, while line 79 is coupled to each of memory units 72-74.

Thus, in the memory device 70 of the exemplary embodiment of FIG. 5, both the bus system comprising lines 75-77 conducting signals having the given signal type and the bus system comprising lines 78, 79 conducting signals having the further given signal type are designed so that, while at least one of the memory units 71-74 has a dedicated bus, several other memory units share a bus. In particular, in the exemplary embodiment of FIG. 5, one of the memory units, namely memory unit 71, has a dedicated bus both in the bus system conducting signals having the given signal type and in the bus system conducting signals having the further given signal type. It will be appreciated that in additional to or instead of each of the lines 75-79 plural lines may be provided to conduct plural signals to the respective memory units.

As has already been explained with reference to FIG. 4 above, also in the case in which signals having several different signal type are to be conducted to the memory units via respective bus systems, for any one of the bus systems the selection of memory units that have their own dedicated bus and the selection of memory units that share a bus may be made based on any suitable criterion. In exemplary embodiments, the criteria comprise relative positions of the memory units and/or a switching behavior anticipated for signals having a given signal type.

It will be appreciated that the grouping of memory units that share busses or are provided with dedicated busses, respectively, as schematically illustrated in FIG. 5 is only exemplary, and that the bus systems for routing signals having the given and further given signal types may also be configured differently in other embodiments. For example, in another embodiment, one of the bus systems may also be configured so that all memory units share one common bus or line for signals having a given signal type. Still further, while only bus systems 75-78 and 78, 79 and corresponding gating cells 82-84 and 92, 93, respectively, are included in the schematic representation of FIG. 5, memory devices according to other embodiments may comprise a larger number of bus systems and respective gating cells to conduct a larger number of signals having different signal types to the memory units.

As has been explained with reference to FIGS. 2-5 above, signals received at the routing unit are routed to the memory units via one or several of the lines connecting the routing unit to the memory units, the routing being controlled based on the control signal that may comprise, e.g., a CS signal and address information. The control signal may be provided by a processor core. In an embodiment, the routing unit may further comprise a routing logic to perform more complex routing operations. For example, in one embodiment, the routing unit comprises routing logic that is configured to route signals corresponding to data based on address information that has previously been received in an address signal.

While the routing unit of the memory devices according to the exemplary embodiments described with reference to FIGS. 2-5 is shown to be configured as a gating unit comprising a plurality of gating cells, in other embodiments the routing unit may be implemented differently, e.g., based on one or a plurality of controllable demultiplexers.

While the integrated circuits according to the exemplary embodiments described with reference to FIGS. 1-5 above are respectively configured as memory devices, the present invention is not limited thereto. Rather, in other embodiments, integrated circuits may comprise logical elements other than memory units. As used herein, the term "logical element" refers to any element which is configured to receive signals via a bus and to perform actions based on the signal, such as processing data, outputting data, performing a pre-defined function or similar. For example only, the logical elements may be selected from a group comprising input/output (I/O) interfaces, data processing circuits, antennas, e.g., a universal mobile telecommunications system (UMTS) antenna, counter circuits, or watch dog timers. It is to be understood that these are only exemplary logical elements, and that the logical elements may also be implemented by any other circuit or component suitable for the contemplated application of the integrated circuit.

Figure 6:
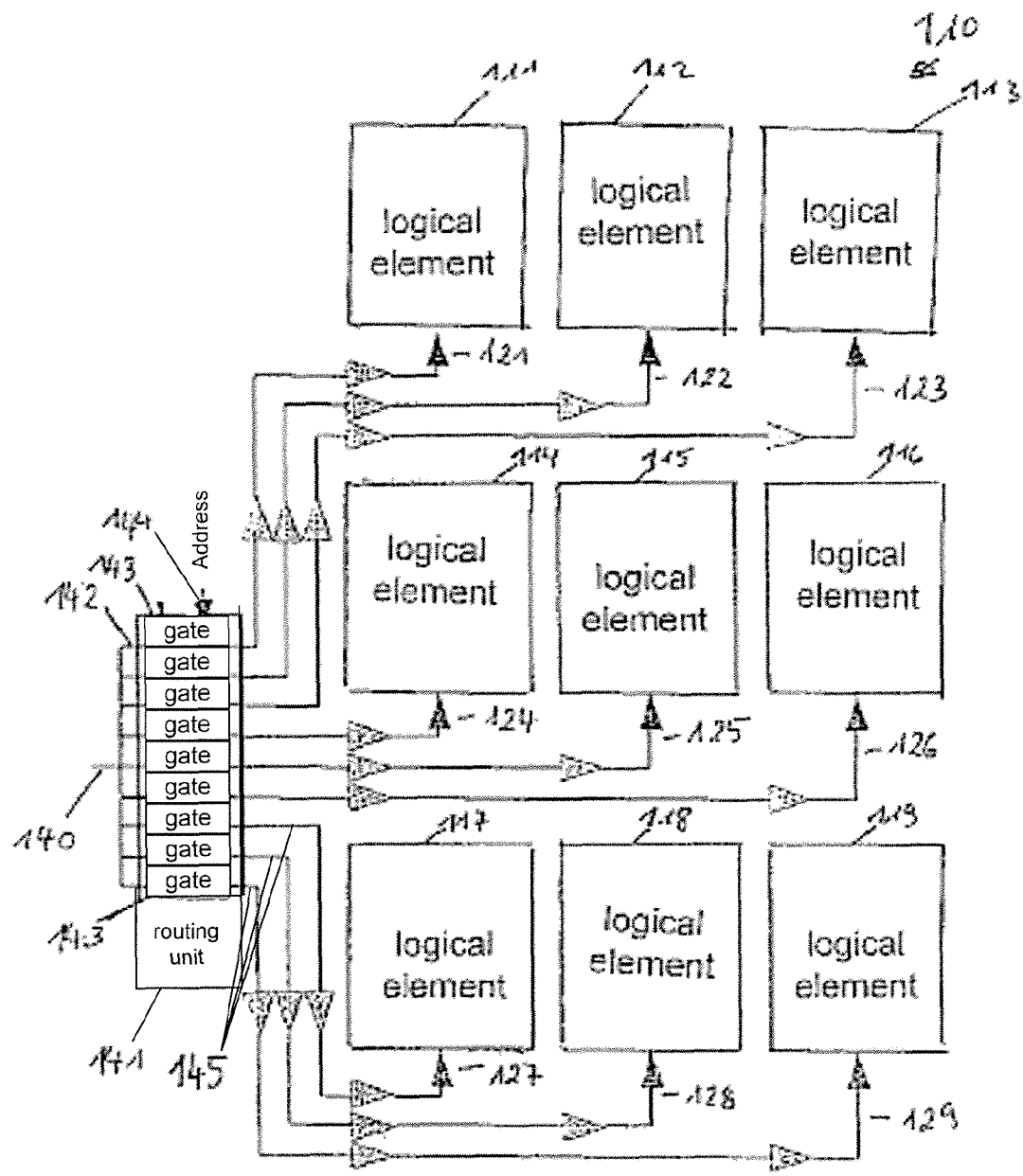
FIG. 6 is a schematic block diagram representation of an integrated circuit according to another embodiment of the present invention.

FIG. 6 is a schematic block diagram representation of an integrated circuit 110 according to another embodiment of the invention which comprises a plurality of logical elements 111-119. A common bus 140 carries signals, e.g., data, address or control signals, for the plurality of logical elements 111-119. A routing unit 141 has an input 142 coupled to the bus 140 and a plurality of outputs 145 to route signals received at the input 142 to the logical elements. In the exemplary embodiment of FIG. 6, each of the logical elements 111-119 is coupled to the routing unit 141 by a line 121-129 which only connects to one of the logical elements 111-119. In other words, signal routing is already performed on the common bus. The operation, configuration and coupling of the other elements shown in FIG. 6 corresponds to the one of the corresponding elements shown in FIG. 2 and explained in detail above, corresponding elements being indicated by the reference numerals of FIG. 2 incremented by one hundred.

While in the exemplary embodiment of FIG. 6 the integrated circuit 110 comprises nine logical elements 111-119, each of which has a dedicated line or bus 121-129 to conduct signals from the routing unit to one of the logical elements 111-119, the present invention is not limited thereto and other numbers of logical elements and other connections between the routing unit and the logical elements may be implemented.

Figure 7:
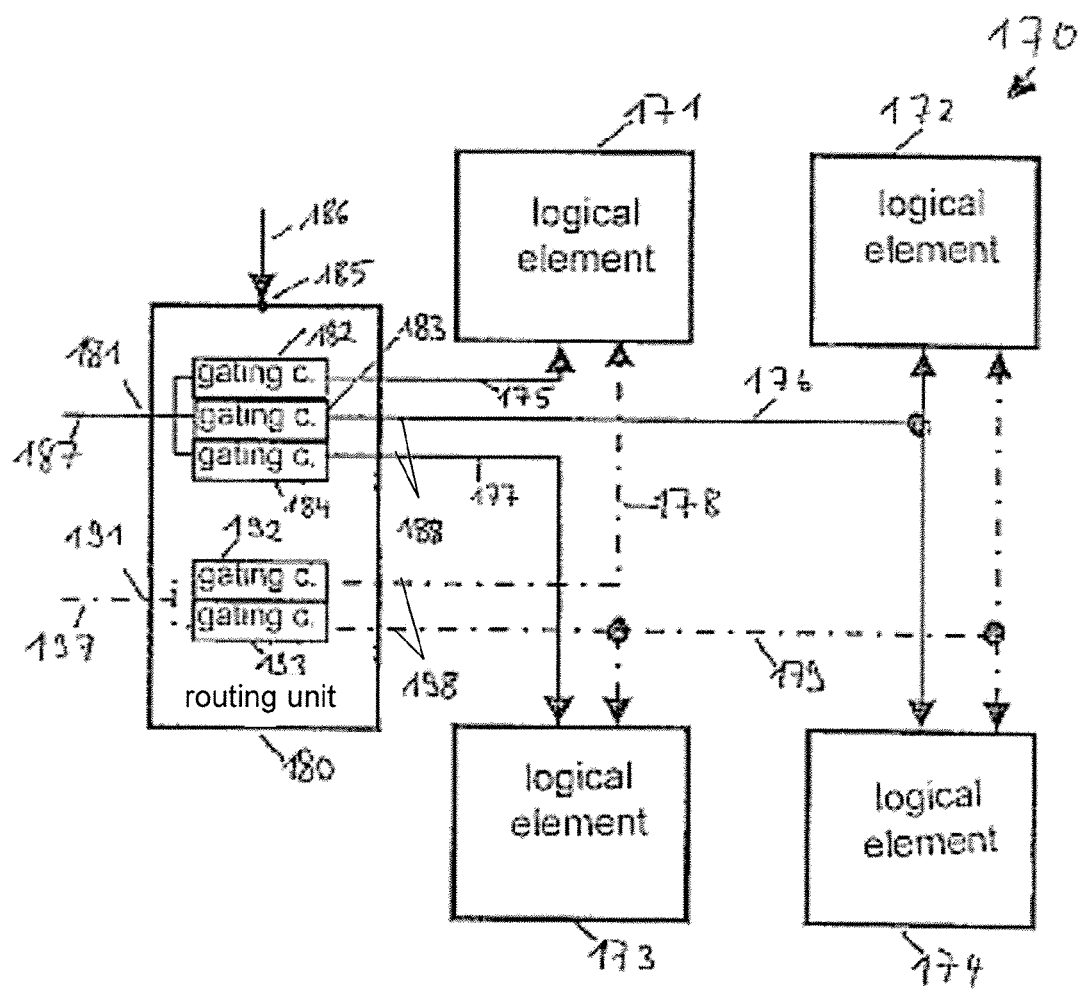
FIG. 7 is a schematic block diagram representation of an integrated circuit according to another embodiment of the present invention.

Only as a further exemplary embodiment, FIG. 7 shows a schematic block diagram representation of an integrated circuit 170 according to another embodiment, comprising four logical elements 171-174 and a routing unit 180 having an input coupled to a bus carrying signals 187, 197 for the logical elements 171-174. As may be seen in FIG. 7, for each of the signals, lines or busses may be provided which connect the routing unit 180 to only one logical element, such as lines 175, 177 and 188, or to several of the logical elements, such as lines 176 and 179. The selection of logical elements that share busses may again be made based on any one of the criteria explained with reference to FIGS. 4 and 5 above. In one embodiment, at least one of the logical elements is connected to the routing unit by at least two lines, each of which connects the routing unit to only the one logical element. In an embodiment, at least two of the logical elements are respectively connected to the routing unit by at least two lines which connect the routing unit to only the respective logical elements. The operation, configuration and coupling of the other elements shown in FIG. 7 corresponds to the one of the corresponding elements shown in FIG. 5 and explained in detail above, corresponding elements being indicated by the reference numerals of FIG. 5 incremented by one hundred.

Figure 8:
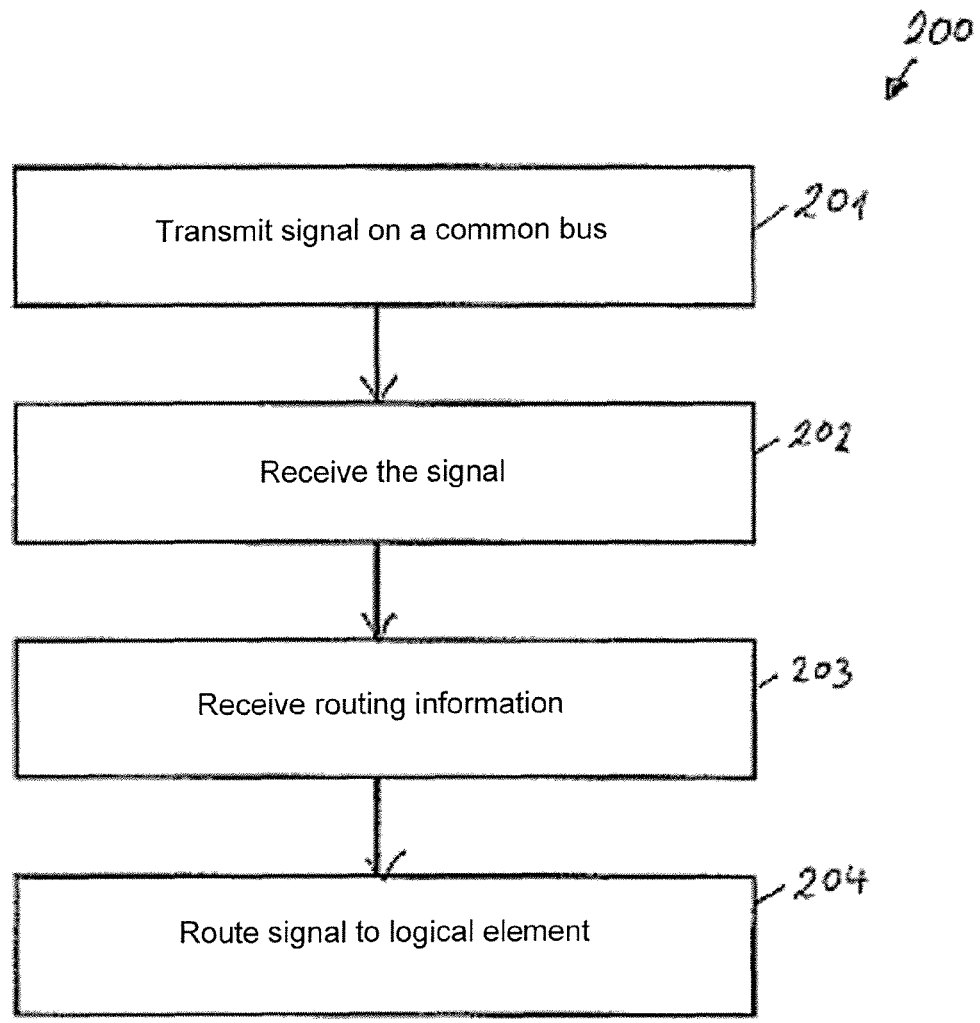
FIG. 8 is a flow diagram representation of a method of operating an integrated circuit according to an embodiment of the present invention.
Figure 3:
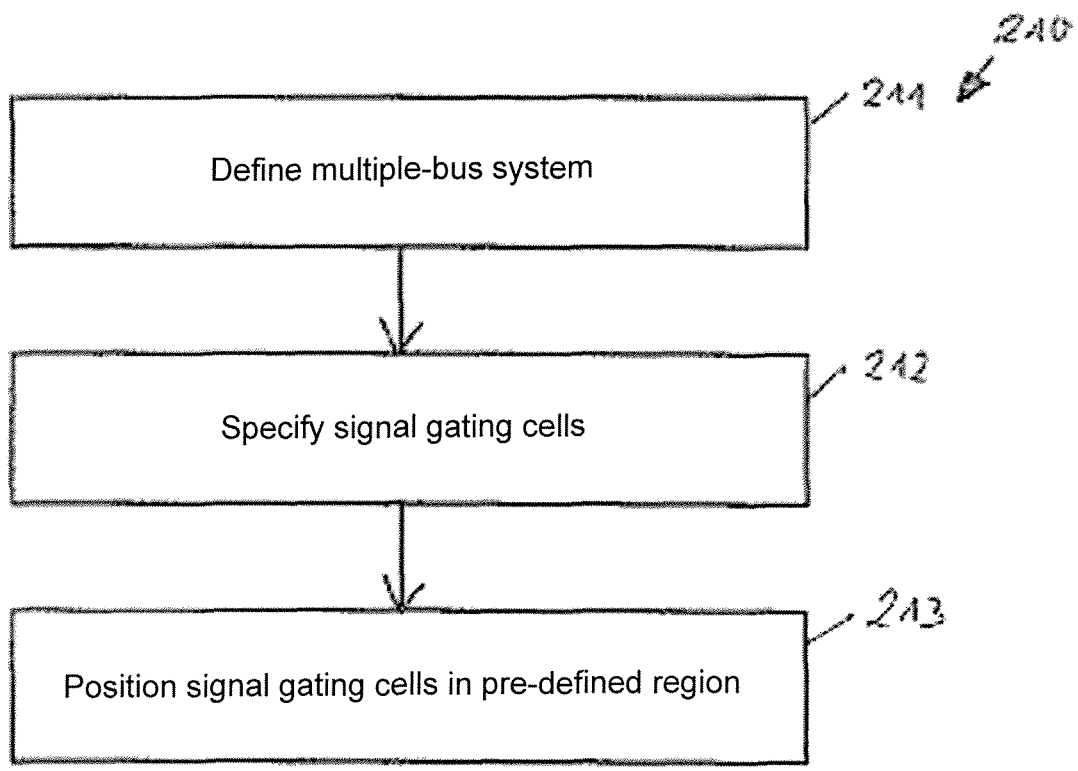

FIG. 8 is a flow diagram representation of a method of operating an integrated circuit which includes a plurality of logical elements, the method being generally indicated by reference numeral 200. At 201, a signal is transmitted on a common bus, the common bus carrying signals for all logical elements. At 202, the signal transmitted on the common bus is received. At 203, the routing information for the signal is received. The routing information may, e.g., comprise address information and control signals, such as a CS signal. At 204, the received signal is routed to one of the logical elements via a bus which connects the routing unit to only the one logical element. In an embodiment, the logical elements may comprise memory units and the integrated circuit may form a memory device.

Figure 10:
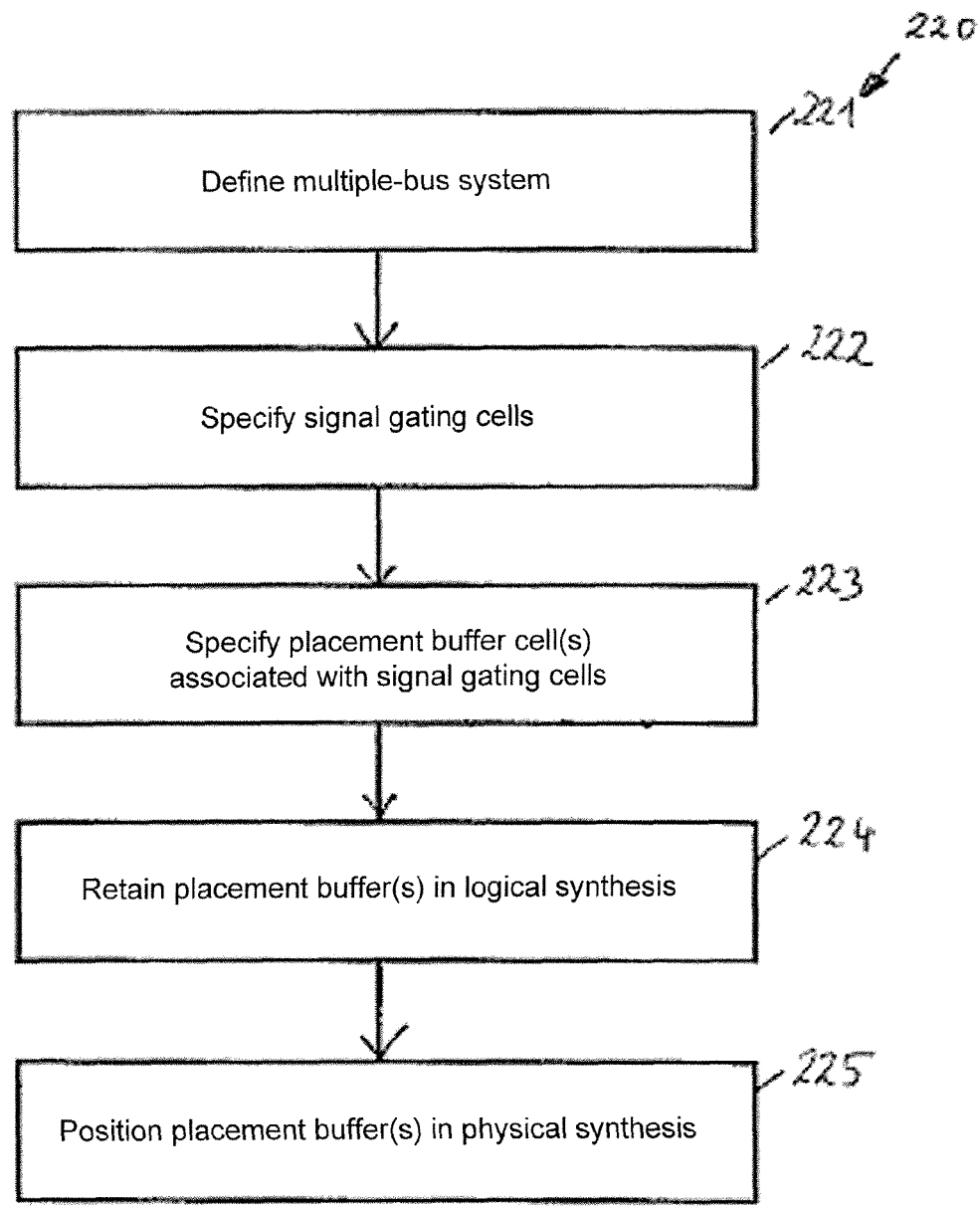
FIG. 10 is a flow diagram representation of a method of designing an integrated circuit according to another embodiment of the present invention.

With reference to FIGS. 9 and 10, methods of designing an integrated circuit, e.g., a memory device according to exemplary embodiments of the invention will be described. In an embodiment, the methods may be employed to design the memory devices according to the various embodiments of the invention explained with reference to FIGS. 1-5 above. In another embodiment, the methods may be employed to design the integrated circuits of FIGS. 6 and 7.

FIG. 9 is a flow diagram representation of a method of designing an integrated circuit according to an exemplary embodiment of the invention. The method is generally indicated at 210. At 211, for an integrated circuit comprising a pre-determined number of logical elements, a multiple-bus system is defined to provide signals to the logical elements. The multiple-bus system comprises a plurality of lines that connect to the logical elements. In an embodiment, at least one of the lines is connected to only one of the logical elements. In another embodiment, all lines for a given signal type are respectively connected to only one of the logical elements. In an embodiment, the defining at 211 comprises specifying which of the logical elements is intended to be connected to another component of the integrated circuit, e.g., a gating cell. At 212, signal gating cells are specified. In an embodiment, specifying the signal gating cells at 212 comprises specifying the function of the respective signal gating cells and specifying connections between the signal gating cells and the multiple-bus system. In an embodiment, the specifying at 212 comprises defining a gating behavior of the signal gating cells based on a control signal. The definition of the bus system at 211 and the specifying of the signal gating cells at 212 may be performed utilizing a hardware description language (HDL), e.g., the Verilog hardware description language or VHDL.

At 213, the signal gating cells are positioned in a pre-defined region. In an embodiment, the pre-defined region is a region adjacent to or otherwise in proximity to a root end of the multiple-bus system. In another embodiment, the signal gating cells are placed so as to be in proximity to each other.

The placement of the signal gating cells at 213 may be effected in various ways. In an exemplary embodiment, the positioning at 213 comprises performing a logical synthesis and "manually" placing, i.e., specifying the position of, the signal gating cells in a physical synthesis of the integrated circuit, utilizing, e.g., place and route tools. In an embodiment, the logical and physical synthesis may be performed utilizing electronic design automation tools.

FIG. 10 is a flow diagram representation of a method of designing an integrated circuit according to another exemplary embodiment of the invention. The method is generally indicated at 220. At 221, for an integrated circuit comprising a pre-determined number of logical elements, a multiple-bus system is defined to provide signals to the logical elements, and at 222, signal gating cells are specified. The defining of the bus system at 221 and the specifying of the signal gating cells at 222 may be implemented in any one of the ways described with reference to 211 and 212 of FIG. 9 above. At 223, one or several placement buffer cells are specified, which are associated with the signal gating cells. In an embodiment, the placement buffer cells are inserted along a signal path after the signal gating cells. In one embodiment, one placement buffer cell may be connected to each of the signal gating cells. The placement buffer cells may, for example, correspond to amplifier cells 47 as schematically shown in the placement buffer 46 of FIG. 3.

In an embodiment, the defining the bus system at 221, the specifying the signal cells at 222 and the specifying the placement buffers at 223 may be performed utilizing a hardware description language. At 224, when a logical synthesis is performed, the placement buffers are retained as elements in the logical synthesis. At 225, when a physical synthesis is performed, the placement buffers are positioned in a pre-defined region. In an embodiment, the placement buffers are positioned in a desired region adjacent to or otherwise in proximity to the root end of the bus system. In an embodiment, the positioning of the placement buffers may be performed utilizing a place and route tool.

In the method 220 of the exemplary embodiment of FIG. 10, by preserving the placement buffers in the logical synthesis and positioning them in a pre-defined region in the physical synthesis, placement of the gating cells that are connected to the placement buffers in the pre-defined region may be enforced.

As may be seen from the description of methods of designing integrated circuits according to exemplary embodiments given with reference to FIGS. 9 and 10, integrated circuits, e.g., memory devices, according to various embodiments of the present invention may be designed by defining a multiple-bus system, inserting signal gating cells into the bus system and enforcing correct placement of the signal gating cells in a pre-defined region. As will be appreciated from the foregoing description, enforcing correct placement may be effected in various ways, e.g., by directly forcing placement of the signal gating cells in the pre-defined region in physical synthesis, or by forcing placement of the signal gating cells by defining and placing placement buffer cells.

The defining the bus system and the specifying the signal gating cells may be based on various criteria. In one embodiment, for each signal type, logical elements are selected that are to be provided with a dedicated bus and signal gating cell, and the bus system and signal gating cells are defined accordingly. In another embodiment, for each signal type, logical elements are selected that are to be coupled to a joint bus, and the bus system and signal gating cells are defined accordingly. In an embodiment, the selecting of the logical elements may be based on criteria such as a geometrical arrangement of the logical elements in the integrated circuit and/or an anticipated switching behavior of the respective signal type. In an embodiment, the methods 210 and 220 of the exemplary embodiments of FIGS. 9 and 10, respectively, may be recursively re-iterated after an integrated circuit design has been determined, the selection criteria for the logical elements that are to be provided with a dedicated bus or for the logical elements that are to share a joint bus being applied based on the geometrical arrangement of logical elements obtained in a previous iteration.

While the present invention has been explained with reference to specific exemplary embodiments above, it is to be understood that this description is given only for the purpose of better illustrating the principles of the invention and is by no means to be taken in a limiting sense. Rather, modifications and variations of the above exemplary embodiments may be implemented in other embodiments that still fall within the spirit and scope of the present invention. For example, while integrated circuits, e.g., memory devices, comprising nine or four logical elements, e.g., memory units, have been described above, according to various other embodiments integrated circuits may comprise any suitable number of logical elements. Similarly, while bus systems for the routing of signals having one or two different signal types have been illustrated in the drawings and explained above, integrated circuits according to various other embodiments may be implemented so as to include bus systems for routing any number of signals having different signal types, e.g., on the order of several ten or a few hundred of signals.

All such modifications are intended to represent embodiments of the present invention as long as they fall within the scope and spirit of the present invention as defined by the appended claims.

What is claimed is:
1. An integrated circuit, comprising:
a plurality of logical elements;
a bus carrying signals for said plurality of logical elements;
a demultiplexer having an input coupled to said bus and a plurality of outputs to route signals received at said input to at least one of said outputs; and a plurality of lines coupled to said plurality of outputs to conduct said signals from said demultiplexer to at least one of said plurality of logical elements;
wherein each of said plurality of logical elements includes only one input terminal that is coupled to said demultiplexer by only one line which is coupled to only one logical element.

2. The integrated circuit of claim 1, wherein said logical element is disposed adjacent to said further logical element.

3. The integrated circuit of claim 1, wherein said demultiplexer comprises a plurality of gating cells respectively coupled to said plurality of outputs to route information from said input to one of said outputs, said plurality of gating cells being disposed adjacent to one another.

4. The integrated circuit of claim 3, further comprising:
a plurality of amplifier cells disposed adjacent to said plurality of gating cells to amplify said signals output at said outputs, said plurality of lines being coupled to said plurality of gating cells via said plurality of amplifier cells.

5. The integrated circuit of claim 1, wherein said demultiplexer comprises a control input to receive a control signal, said demultiplexer being configured to route a signal received at said input to one of said outputs based on said control signal.

6. The integrated circuit of claim 5, wherein said control signal comprises an address information.

7. The integrated circuit of claim 1, wherein said plurality of logical elements comprises a plurality of memory units.

8. A memory device, comprising:
a plurality of memory units;
a demultiplexer having an input to receive a plurality of signals and having a plurality of outputs to output said plurality of signals; and
a first plurality of lines coupled to the plurality of memory units and to said demultiplexer to conduct signals of said plurality of signals from said demultiplexer to said plurality of memory units,
wherein at least one of said first plurality of lines is coupled to only one of the plurality of memory units, the memory units each having only one input, to allow one of the plurality of signals to be conducted to only the respective memory unit, the one of the memory units being a first memory unit.

9. The memory device of claim 8, further comprising:
a second plurality of lines connected to a second memory unit to conduct signals of said plurality of signals from said demultiplexer to said second memory unit, said second memory unit being different from said first memory unit;
wherein a portion of said second plurality of lines is coupled to only said second memory unit.

10. The memory device of claim 9, wherein at least one of said second plurality of lines is also a first line coupled to said first memory unit.

11. The memory device of claim 9, wherein said demultiplexer comprises a first plurality of gating cells coupled to said first plurality of lines and a second plurality of gating cells coupled to said second plurality of lines.

12. The memory device of claim 11, wherein:
said demultiplexer comprises an input to receive a control signal, and
only one of said first plurality of gating cells or only one of said second plurality of gating cells outputs a signal received at said input to one of said first plurality of lines or one of said second plurality of lines based on said control signal.

13. The memory device of claim 9, wherein said demultiplexer is disposed adjacent to a root of a bus system comprising said first plurality of lines and said second plurality of lines.

14. The memory device of claim 8, wherein said memory device is an integrated circuit.

15. The memory device of claim 8, wherein said plurality of signals comprise data signals, address signals and/or bit select signals.

16. A method of operating an integrated circuit, said integrated circuit comprising a plurality of logical elements, said method comprising:
providing, for each of said plurality of logical elements, a bus that is coupled to only the respective logical element;
transmitting a signal on a common bus;
receiving said signal into a demultiplexer;
receiving routing information; and
routing said signal to one of said logical elements via the bus coupled to only said one logical element, based on said routing information.

17. The method of claim 16, wherein said routing information comprises address information.

18. The method of claim 16, wherein said routing comprises selecting said bus from a plurality of busses coupled to said plurality of logical elements.

19. The method of claim 16, wherein said plurality of logical elements comprises a plurality of memory units.

20. A method of designing an integrated circuit, said integrated circuit comprising a plurality of logical elements, the method comprising:
specifying a plurality of cells, each having an output to be coupled to only one of said plurality of logical elements;
defining signal connections between said plurality of cells and said plurality of logical elements, only one of said signal connections being coupled to only one of said plurality of logical elements; and
ensuring placement of said plurality of cells in a predefined region;
wherein said pre-defined region is disposed adjacent to a root end of said signal connections in a demultiplexer.

21. The method of claim 20, wherein said plurality of cells comprises a plurality of signal gating cells to route signals to at least one of said plurality of logical elements.

22. The method of claim 21, wherein said ensuring placement comprises positioning said plurality of cells in said pre-defined region in a physical synthesis of said integrated circuit.

23. The method of claim 20, wherein said ensuring placement comprises specifying at least one placement buffer associated with said plurality of cells.

24. The method of claim 23, wherein said ensuring placement comprises positioning said at least one placement buffer in said pre-defined region in a physical synthesis of said integrated circuit.

25. The method of claim 20, wherein said plurality of cells are specified and said signal connections are defined utilizing a hardware description language.

26. The method of claim 20, wherein:
said specifying comprises specifying a plurality of signal gating cells for signals having a given signal type, each signal gating cell of said plurality of signal gating cells having an output to output said signals to one logical element, each of said plurality of signal gating cells being connected to said one logical element by a line which connects to only said one logical element.

27. The method of claim 20, wherein said plurality of logical elements comprises a plurality of memory units.

\* \* \* \* \*